(12) United States Patent
Markarian et al.

(10) Patent No.: US 6,553,539 B1
(45) Date of Patent: Apr. 22, 2003

(54) ENCODING INPUT DIGITAL WORDS TO FORM ENCODED OUTPUT SYMBOLS

(75) Inventors: Garegin Markarian, Chilworth (GB); Keith Pickavance, Romsey (GB)

(73) Assignee: Tandberg Television ASA, Lysaker (NO)

( * ) Notice: Subject to any disclaimer, the term of this patent is extended or adjusted under 35 U.S.C. 154(b) by 0 days.

(21) Appl. No.: 09/392,503

(22) Filed: Sep. 9, 1999

(30) Foreign Application Priority Data

Sep. 10, 1998 (GB) .......................................... 9819687

(51) Int. Cl.$^7$ ............................................. H03M 13/00
(52) U.S. Cl. ........................................ 714/790; 714/755
(58) Field of Search .......................... 714/755, 792–794, 714/786, 790; 375/265, 295

(56) References Cited

U.S. PATENT DOCUMENTS

| 5,812,601 | A | * | 9/1998 | Schramm ..................... 375/262 |
| 5,907,582 | A | * | 5/1999 | Yi ............................... 370/208 |
| 6,088,387 | A | * | 7/2000 | Gelblum et al. ............. 375/222 |

FOREIGN PATENT DOCUMENTS

| EP | 9848517 | 4/1998 | .......... H03M/13/00 |

OTHER PUBLICATIONS

Le Goff et al, "Turbo—codes and high specral efficiency modulation" Telecom Bretaigne, France university, May 1, 1994 (IEEE).*
Goff S L et al: "Turbo–Codes and High Spectral Efficiency Modulation" Serving Humanity Through Communications. Supercomm/ICC. New Orleans, May 1–5, 1994, ICC, New York, IEEE, USA, vol. 2, May 1, 1994, pp 645–649.

Burkert F et al: "Turbo–Decoding With Unequal Error Protection Applied to GSM Speech Coding" Communications: The Key to Global Prosperity. Globecom 1996. London Nov. 18–22, 1996, Globecom, New York IEEE, US, vol. 3, Nov. 18, 1996 pp 2044–2048.

Fazel et al: "Combined Multilevel Turbo–Code With 8PSK Modulation", Globecom 1995. Conference Record. Communication Theory Mini–Conference, Globecom '95, IEEE Singapore Nov 13–17, 1995, New York, NY USA, IEEE, US, Nov. 13, 1995, pp 649–653.

(List continued on next page.)

*Primary Examiner*—Albert Decady
*Assistant Examiner*—Esaw Abraham
(74) *Attorney, Agent, or Firm*—Douglas S. Rupert; Wildman, Harrold, Allen & Dixon

(57) ABSTRACT

The present invention relates to a method and apparatus for encoding input words consisting of a plurality of information bits so as to produce encoded output symbols. The invention has particular application to the production of encoded output symbols which are to be subject to phase shift key (PSK) modulation. The invention is advantageously employed in generating phase shift key modulated signals for digital television signal transmission. A turbo encoder is used to receive and encode a first portion of each input word so as to generate corresponding encoded and parity bits from the input words. A puncturing module punctures the parity bits once for each encoded bit. A mapping circuit receives an uncoded second portion of each input word and forms an output symbol for each input word from the uncoded second portion and from the corresponding encoded and punctured parity bits.

11 Claims, 2 Drawing Sheets

OTHER PUBLICATIONS

Papke L et al: "Combined Multilevel Turbo–Code With MR–Modulation" Communications—Gateway To Globalisation. Proceedings of the Conference on Communications. Seattle, Jun. 18–22–, New York, IEEE, US, vol. 2, Jun. 18, 1995, pp 668–672.

Xiaofan Fei et al: "Turbo–Codes Used for Compressed Image Transmission Over Frequency Selective Fading Channel" Globecom '97, IEEE Phoenix, AZ, USA Nov. 3–8, 1997, New York, USA, IEEE, US, Nov. 3, 1997, pp 629–633.

Robertson, P et al: "Extensions of Turbo Trellis Coded Modulation to High Bandwidth Efficiencies", Communications, 1997. ICC '97 Montreal, Towards the Knowledge Millennium. 19997 IEEE, International Conference On Montreal, Que. Canada Jun. 8–12, 1997, New York, NY, USA, IEEE, US, Jun. 8, 1997, pp 1251–1255.

* cited by examiner

ENCODING INPUT DIGITAL WORDS TO FORM ENCODED OUTPUT SYMBOLS

The present invention relates to a method and apparatus for encoding input words consisting of a plurality of information bits so as to produce encoded output symbols. The invention has particular application to the production of encoded output symbols which are to be subject to phase shift key (PSK) modulation. The invention is advantageously employed in generating phase shift key modulated signals for digital television signal transmission.

Recently, a new class of error-control codes, termed "turbo-codes", has been introduced. These codes provide error performance close to the Shannon limit by using an iterative decoding technique that relies upon simple constituent codes. A natural extension to improve the bandwidth efficiency of turbo-codes is to apply them to trellis coded modulation (TCM) and pragmatic trellis coded modulation (PCTM) systems.

In a known modulation system, a turbo-encoder encodes a serial stream of input data bits at a rate R of 1/3 to produce two parity bits in parallel with each input data bit. The information and parity bits are subject to demultiplexing in a demultiplexer so as to form symbols each of which includes a number of information bits and a number of parity bits. The parity bits are punctured in a puncturing module so as to reduce the number of parity bits and thereby increase the data rate of the system. The bits of each symbol are interleaved in an interleaver and passed to a signal mapping module. The output from the mapping module comprises the I and Q components necessary for input to a PSK modulator.

The puncturing operation of the known modulation system depends upon the type of modulation employed and on the desired information rate. In particular, for M-ary modulation with R' information bits per symbol, the number of punctured bits is defined as; $k=3R'-\log M$.

Thus, to generate pragmatic turbo-coded 8-PSK modulation with R'=2 bits/symbol, the known technique will require the puncturing of k=3 parity bits. For the case of 16 PSK modulation, with R'=3 bits/symbol, the technique will require the puncturing of k=5 parity bits.

It is known that puncturing provides the desired data rates at the expense of a reduction in the free distance of the code which results in a reduced error performance of the overall system. Furthermore, the need to change the number of punctured bits, depending upon the required data rate, reduces the flexibility of operation.

It is one aim of the present invention to achieve the desired data rate whilst reducing the number of punctured parity bits. A subsidiary aim of the present invention is to increase the flexibility of operation to cope with changes in the desired data rate.

According to the present invention, there is now provided apparatus to encode input digital words of information bits so as to produce output symbols representing the input digital words, the apparatus comprising: a turbo encoder to receive and encode a first portion of each input word so as to generate corresponding encoded and parity bits; a puncturing module to puncture the parity bits once for each encoded bit; and, a mapping circuit to receive an uncoded second portion of each input word, the mapping circuit being adapted to form an output symbol for each input word from the uncoded second portion and from the corresponding encoded and punctured parity bits.

Further according to the present invention, there is provided a method of encoding input digital words of information bits so as to produce output symbols representing the input digital words, the method comprising the steps of: employing a turbo encoder to receive and encode a first portion of each input word so as to generate corresponding encoded and parity bits; puncturing the parity bits once for each encoded bit; and, forming an output symbol for each input word from an uncoded second portion of the input word and from the corresponding encoded and punctured parity bits.

The invention will now be described, by way of example, with reference to the accompanying drawings in which.

Figure 1:
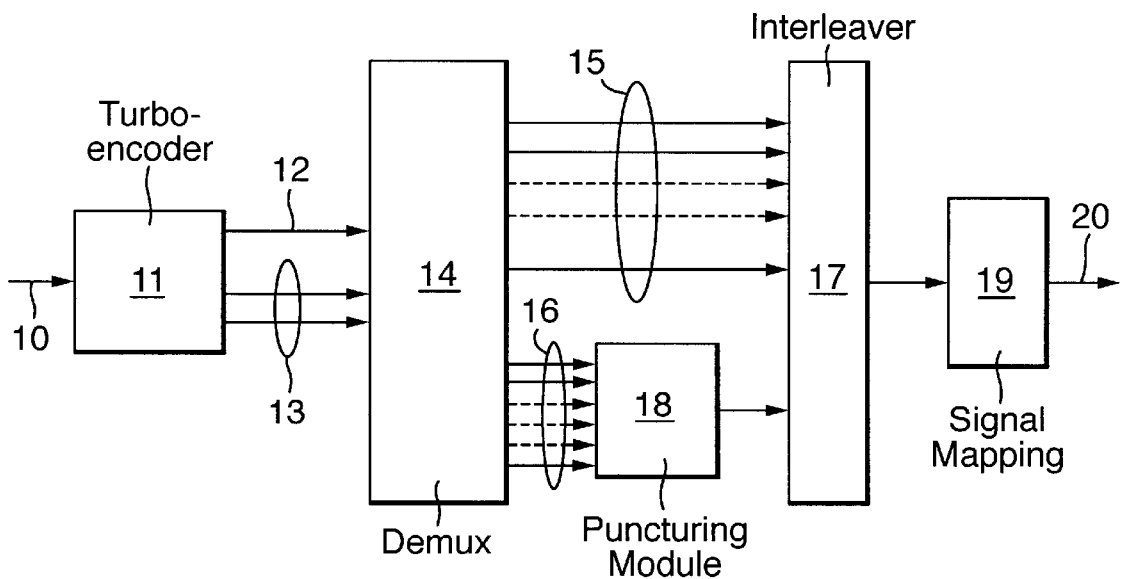
FIG. 1 shows a known form of pragmatic turbo coded modulator.

In FIG. 1, a bitstream of input digital data is applied to an input terminal 10 and is received by a turbo-encoder 11. The turbo-encoder 11 is of the form of any one of a number of known turbo-encoders as described in the literature. The turbo-encoder has a rate R of 1/3 so as to produce one encoded bit on line 12 and two parity bits on parity lines 13 for each of the input bits on line 10.

The encoded bit on line 12 has the same value as the input bit on line 10. The encoded and parity bits from the turbo-encoder 11 on lines 12 and 13 are applied to a demultiplexer 14. The demultiplexer 14 converts the turbo-encoded bits from the encoder 11 from serial to parallel form. The parallel output from the demultiplexer 14 includes encoded bits on lines 15 and parity bits on lines 16. The lines 15 and 16 in FIG. 1 are shown in both full lines and dotted lines to indicate that the number of parallel outputs from the demultiplexer 14 is a matter of design choice as will be explained.

The encoded bits on the lines 15 are applied as input bits to an interleaver 17. The parity bits on the lines 16 are applied to a puncturing module 18 which punctures the parity bits so as to reduce the number of parity bits to one. The parity bit that remains following the puncturing operation carried out by the module 18 is applied to the interleaver 17. The interleaver interleaves the encoded and parity bits applied as input thereto and presents the interleaved bits to a signal mapping circuit 19. The mapping circuit 19 maps the digital values represented by the interleaved bits into M-ary symbols which are output on a line 20. The symbols on the line 20 are transmitted as a multilevel digital signal which is applied to modulate an output carrier transmission.

It will be seen from the known modulation scheme of FIG. 1 that two parity bits are generated for each encoded information bit which is received by the input terminal 10. Consequently, where the output modulation is 8-PSK, and there are 2 information bits and one parity bit per symbol, the known scheme requires the puncturing of 3 parity bits. Alternatively, where the output modulation is 16 PSK and there are 3 information bits and one parity bit per symbol, the known scheme requires the puncturing of 5 parity bits. The number of lines 15 and 16 in FIG. 1 will thus depend on the number of bits per symbol in the output modulation.

Figure 2:
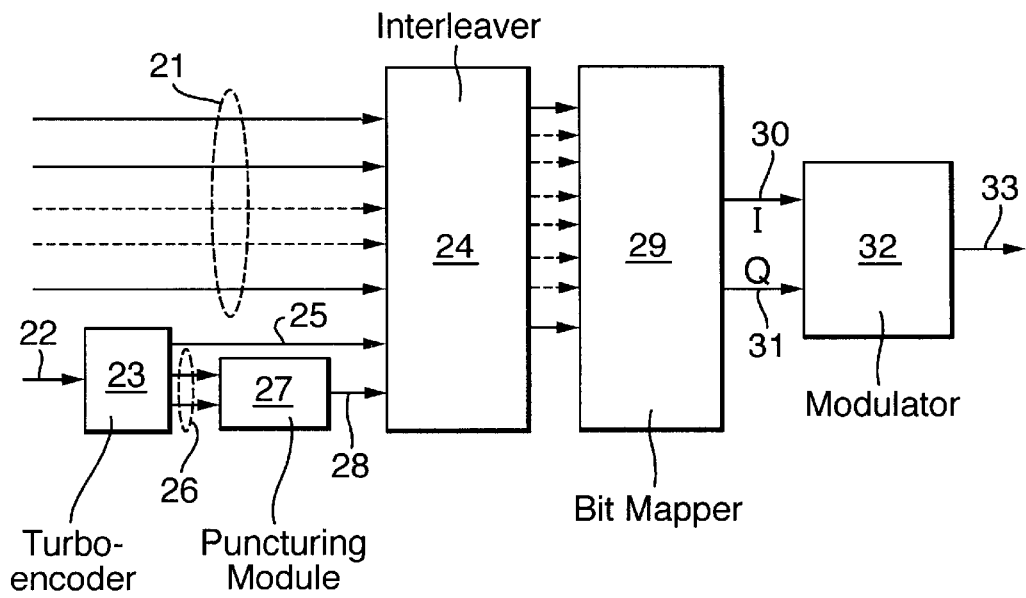
FIG. 2 is a generic diagram of a pragmatic turbo coded modulator according to the present invention.

In FIG. 2, there is shown a modulator apparatus having a set of input terminals 21 together with an additional input terminal 22. The input terminals 21 and 22 together constitute the required number of parallel input terminals to receive an input word of k information bits. The input terminal 22 is connected to supply one bit of each input word to a turbo-encoder 23 and the input terminals 21 are connected to supply the remaining information bits to an interleaver 24. The particular number of input terminals 21 depends on the word size of each input word and the input lines 21 are shown in both full lines and dotted lines to indicate that this number is a matter of design choice.

The turbo encoder 23 has a rate of 1/3 and produces one encoded information bit on a line 25 and two parity bits on lines 26. The parity bits are punctured once by means of a puncturing module 27 to produce a parity bit on an output line 28 from the puncturing module 27. The lines 25 and 28 are connected in parallel with the input lines 21 to provide inputs to the interleaver 24. The interleaver 24 interleaves the uncoded information bits on the lines 21 with the encoded information bit on the line 25 and the parity bit on the line 28. The interleaver 24 passes the interleaved bits to a bit mapping circuit 29 which converts the interleaved bits to a symbol representing k information bits and one parity bit. The symbol is represented by I and Q component values on lines 30 and 31 which are passed to a M -ary modulator 32 from which a modulated carrier signal is transmitted on an output line 33. It will be observed that the apparatus shown in FIG. 2 uses only one standard turbo-encoder having a rate R=1/3 but the number of punctured bits has been reduced compared to the prior art arrangement. This has the benefit of improved error performance and reduced implementation complexity and cost.

Figure 3:
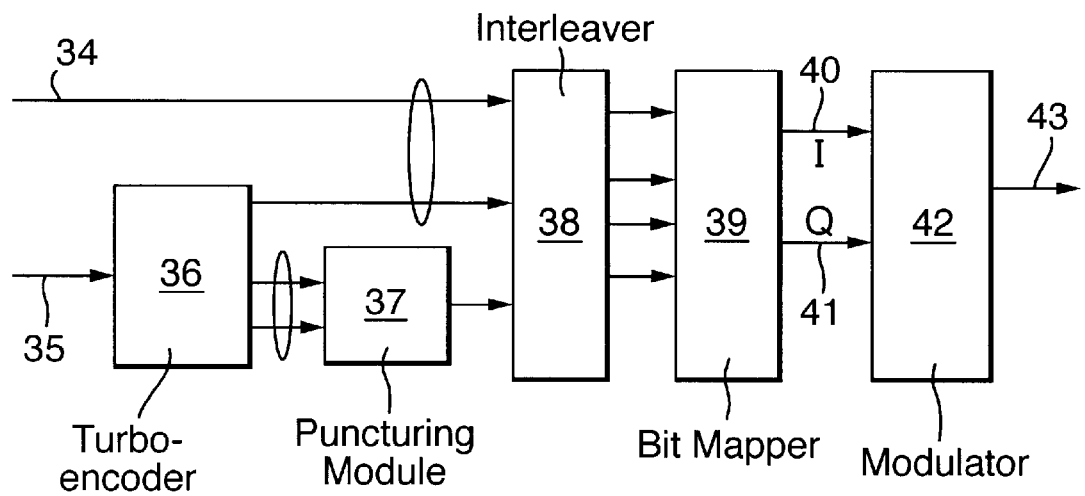
FIG. 3 shows the modulator of FIG. 2 adapted for 8-PSK modulation.

FIG. 3 shows how the apparatus of FIG. 2 can be adapted for the specific case where the output modulation is 8 PSK modulation. In FIG. 3, an input line 34 and an input line 35 each receive a respective information bit of a 2-bit input word. The input line 35 is connected to a turbo-encoder 36 which has a rate R of 1/3 and therefore generates one encoded information bit and two parity bits. The parity bits are punctured by means of a puncturing module 37.

For each input word, an interleaver 38 receives one uncoded information bit on the line 34, an encoded information bit from the turbo encoder 36 and a parity bit from the puncturing module 37. The interleaver 38 interleaves the received bits to form a 3-bit word which is supplied to a bit mapping circuit 39. The bit mapping circuit converts the received bits to a symbol representing 2 information bits and one parity bit. The symbol is represented by I and Q component values on lines 40 and 41 which are passed to a 8-PSK modulator 42 from which a modulated carrier signal is transmitted on an output line 43.

Figure 4:
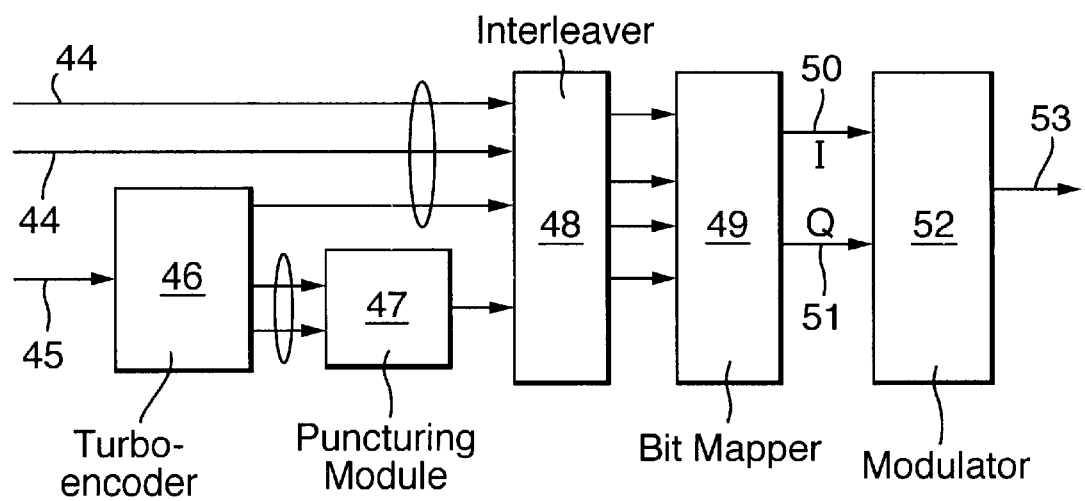
FIG. 4 shows the modulator of FIG. 2 adapted for 16 PSK modulation.

FIG. 4 shows how the apparatus of FIG. 2 can be adapted for the specific case where the output modulation is 16 PSK modulation. In FIG. 4, input lines 44 receive 2 information bits and an input line 45 receives one information bit of a 3-bit input word. The input line 45 is connected to a turbo-encoder 46 which has a rate R of 1/3 and therefore generates one encoded information bit and two parity bits. The parity bits are punctured by means of a puncturing module 47.

For each input word, an interleaver 48 receives two uncoded information bits on the lines 44, an encoded information bit from the turbo encoder 46 and a parity bit from the puncturing module 47. The interleaver 48 interleaves the received bits to form a 4-bit word which is supplied to a bit mapping circuit 49. The bit mapping circuit converts the received bits to a symbol representing 3 information bits and one parity bit. The symbol is represented by I and Q component values on lines 50 and 51 which are passed to a 16-PSK modulator 52 from which a modulated carrier signal is transmitted on an output line 53.

One of the serious drawbacks associated with the application of turbo-codes is the effect of "flattening error degradation" by which is meant the effect whereby the bit error ratio at the output of the turbo-decoder cannot be reduced below certain values which depend on the type of turbo-code and are in the range of $10^{-8}$ to $10^{-9}$. Although this figure is acceptable for most applications, digital television broadcasting requires quasi-error free performance in which the bit error ratio is $10^{-11}$. In order to meet this requirement, the proposed invention should be concatenated with an outer block code (eg, Reed Solomon code), providing that an appropriate interleaver will be placed between the invention and the block code.

What is claimed is:

1. An apparatus to encode input digital words of information bits so as to produce output symbols representing the input digital words, the apparatus comprising: a turbo encoder to receive and encode a first portion of each input digital word so as to generate corresponding encoded bits and parity bits; a puncturing module to puncture the parity bits; and, a mapping circuit to receive an uncoded second portion of each input digital word, said punctured parity bits and the encoded bits, the mapping circuit being adapted to form an output symbol for each input digital word from the uncoded second portion and from the corresponding encoded bits and punctured parity bits.

2. Apparatus as claimed in claim 1, wherein the turbo encoder is adapted to receive and encode one information bit in each input digital word.

3. Apparatus as claimed in claim 1, further comprising a phase shift key (PSK) modulator to produce a modulated output signal representing the output symbols.

4. Apparatus as claimed in claim 3, wherein the modulator comprises an 8-PSK modulator.

5. Apparatus as claimed in claim 3, wherein the modulator comprises a 16 PSK modulator.

6. Apparatus as claimed in claim 1, which is adapted to encode input digital words which represent digital picture information.

7. A method of encoding input digital words of information bits so as to produce output symbols representing the input digital words, the method comprising the steps of: employing a turbo encoder to receive and encode a first portion of each input digital word so as to generate corresponding encoded bits and parity bits; puncturing the parity bits once for each encoded bit thereby producing punctured parity bits; and forming an output symbol for each input digital word from an uncoded second portion of the input digital word and from the corresponding encoded bits and punctured parity bits.

8. A method as claimed in claim 7, comprising the further step of employing a phase shift key (PSK) modulator to generate an output modulated signal representing the output symbols.

9. A method, as claimed in claim 8, wherein the step of modulating the formed output symbols consists of 8-PSK modulation.

10. A method, as claimed in claim 8, wherein the step of modulating the formed output symbols consists of 16-PSK modulation.

11. A method as claimed in any one of claim 7, which is applied to encoding input digital words representing digital picture information.

\* \* \* \* \*